United States Patent
Mulbrook et al.

(10) Patent No.: US 7,173,497 B1
(45) Date of Patent: Feb. 6, 2007

(54) SAMPLING VOLTAGE CONTROLLED OSCILLATOR

(75) Inventors: Mark M. Mulbrook, Marian, IA (US); Robert A. Newgard, Central City, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 48 days.

(21) Appl. No.: 10/982,969

(22) Filed: Nov. 5, 2004

(51) Int. Cl.
*H03B 1/00* (2006.01)

(52) U.S. Cl. ............................... 331/74; 331/34

(58) Field of Classification Search ................ 331/74, 331/34, 47
See application file for complete search history.

(56) References Cited

U.S. PATENT DOCUMENTS 4,733,240 A * 3/1988 Bradley ..................... 342/372

5,361,277 A * 11/1994 Grover ....................... 375/356

* cited by examiner

*Primary Examiner*—Joseph Chang
(74) *Attorney, Agent, or Firm*—Nathan O. Jensen; Kyle Eppele

(57) ABSTRACT

The present invention is an apparatus for efficiently providing an output frequency signal based upon an input voltage. The sampling voltage controlled oscillator of the present invention may include a voltage controlled oscillator coupled with sample and hold circuitry. The voltage controlled oscillator frequency of the sampling voltage controlled oscillator may be a lower frequency whereby the voltage controlled oscillator frequency is sampled by the sample and hold circuitry to derive a higher frequency signal. Advantageously, the overall power consumption of sampling voltage controlled oscillator may be less than conventional voltage controlled oscillators.

11 Claims, 5 Drawing Sheets

SAMPLING VOLTAGE CONTROLLED OSCILLATOR

CROSS REFERENCE TO RELATED APPLICATIONS

The present application is related to U.S. Application Express Mail Label Number EV 515 456 002 US filed on Nov. 5, 2004. Said U.S. Application Express Mail Label Number EV 515 456 002 US filed on Nov. 5, 2004 is hereby incorporated by reference.

FIELD OF THE INVENTION

This invention relates generally to a voltage controlled oscillator and more particularly to a sampling voltage controlled oscillator.

BACKGROUND OF THE INVENTION

Mobile devices such as cellular phones typically rely upon a rechargeable battery as a power source. A reduction in power consumption by components of the mobile device may provide a longer operating capacity for the mobile device. Similarly, all components and devices which rely upon a fixed amount of power may benefit from a reduction in power consumption.

Phase-locked loops are employed in a variety of applications, such as mobile devices, for frequency control. Phase-locked loops may be utilized as frequency synthesizers where it is necessary to generate a precise signal with low spurs and noise. Referring to FIG. 1, a phase-locked loop 100 known to the art is shown. Phase-locked loop 100 includes a reference frequency input 110, phase detector 120, a voltage controlled oscillator 130 and a frequency divider 140. The voltage controlled oscillator 130 of the phase-locked loop 100 may produce an output frequency signal 150. A drawback associated with a conventional phase-locked loop 100 is the power requirement necessary to support the operation of the phase-locked loop 100. For example, the voltage controlled oscillator 130 known to the art substantially contributes to the overall power consumption of the phase-locked loop. In order to provide a high output frequency signal 150, the voltage controlled oscillator 130 must produce a high frequency. The voltage controlled oscillator 130 producing a high frequency requires a substantial amount of power as the power consumption of a voltage controlled oscillator 130 is proportional to the voltage controlled oscillator frequency.

Consequently, a phase-locked loop that reduces the power consumed by the voltage controlled oscillator would be advantageous to provide frequency control for various high frequency applications while reducing the power required for operation of the phase-locked loop.

SUMMARY OF THE INVENTION

Accordingly, the present invention is directed to an apparatus for efficiently providing an output frequency signal based upon an input voltage. In an embodiment of the invention, the sampling voltage controlled oscillator of the present invention may include a voltage controlled oscillator coupled with sample and hold circuitry. The voltage controlled oscillator frequency of the sampling voltage controlled oscillator may operate at a lower frequency whereby the voltage controlled oscillator frequency is sampled by the sample and hold circuitry to derive a higher frequency signal. Advantageously, the overall power consumption of sampling voltage controlled oscillator may be less than conventional voltage controlled oscillators.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

Those numerous objects and advantages of the present invention may be better understood by those skilled in the art by reference to the accompanying figures in which.

DETAILED DESCRIPTION OF THE INVENTION

Reference will now be made in detail to presently preferred embodiments of the invention, examples of which are illustrated in the accompanying drawings.

Figure 1:
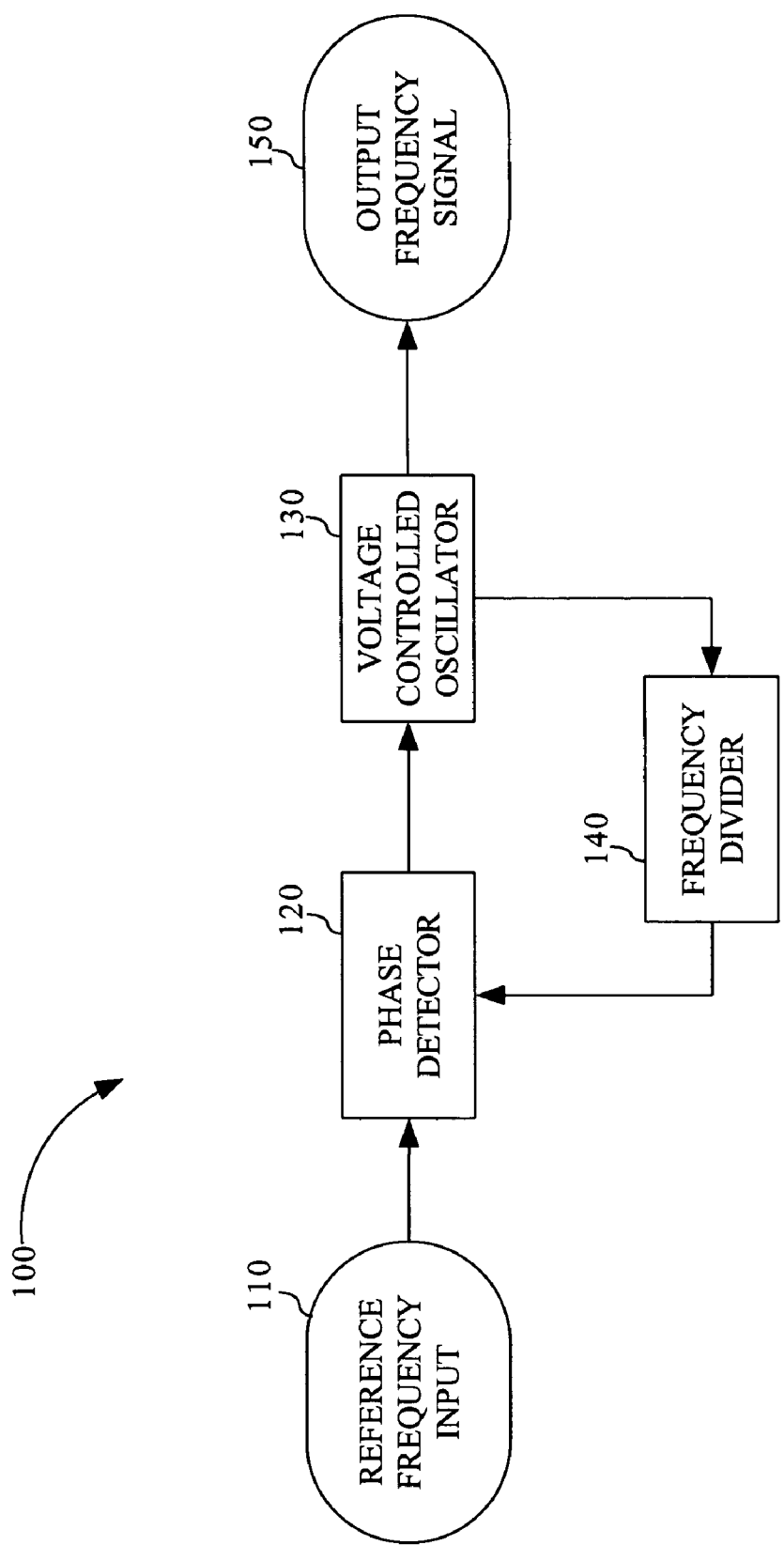
FIG. 1 depicts a block diagram of a phase-locked loop known to the art.
Figure 2:
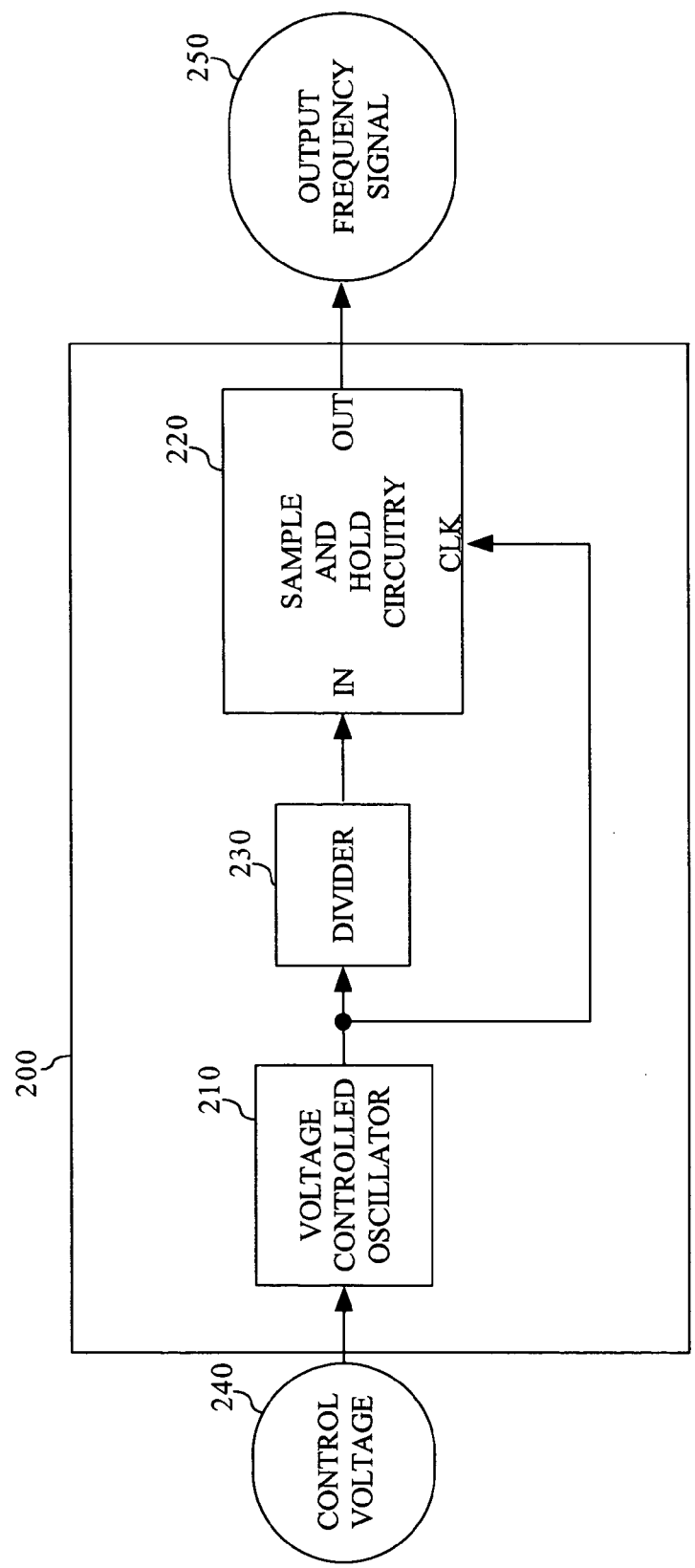
FIG. 2 depicts a block diagram of a sampling voltage controlled oscillator in accordance with an embodiment of the present invention.

Referring to FIG. 2, a block diagram of a sampling voltage controlled oscillator 200 in accordance with an embodiment of the present invention is shown. Sampling voltage controlled oscillator 200 may produce an output frequency signal based upon an input voltage. Sampling voltage controlled oscillator 200 may include a voltage controlled oscillator 210 and sample and hold circuitry 220. Additionally, a frequency divider 230 may be coupled between the voltage controlled oscillator 210 and the input of the sample and hold circuitry 220.

Voltage controlled oscillator 210 may be controlled by a control voltage 240, for example. Sample and hold circuitry 220 may be implemented in a variety of ways by those with skill in the art and may include an input, an output and a clock. The sample and hold circuitry 220 may be fabricated in a wide range of technologies including CMOS, BiCMOS, GaAs, PHEMT, or other device technologies. The implementation may utilize a FET switch, a diode ring switch or a current mode sample with different topologies. It is contemplated that any type of sample and hold circuitry implemented by those with ordinary skill in the art would not depart from the scope and intent of the present invention.

A clock of the sample and hold circuitry 220 may be coupled with the output frequency of voltage controlled oscillator 210. In an alternative embodiment, another frequency source may be supplied to the clock of the sample and hold circuitry 220. The input of the sample and hold circuitry 220 may be the divided output frequency of the voltage controlled oscillator 210. Sample and hold circuitry 220 may derive a higher output frequency signal 250 than the frequency signal produced by the voltage controlled oscillator 210. For example, sample and hold circuitry 220 may create images of an input signal folded around multiples of a clock frequency. This is advantageous as an output frequency signal 250 may be produced by the sampling voltage controlled oscillator 200 with reduced power consumption due to the reduced voltage controlled oscillator frequency of voltage controlled oscillator 210.

For example, in an embodiment of the invention, voltage controlled oscillator 210 may be an 800 MHz voltage controlled oscillator. Frequency divider 230 may be a divide by four (4) divider, creating a 200 MHz input signal to the sample and hold circuitry 220. The clock of the sample and hold circuitry 220 may be the coupled to the frequency signal of the voltage controlled oscillator 210. Through sampling, an output frequency of 3.4 GHz may be produced. In conventional voltage controlled oscillators, the voltage controlled oscillator would need to be close to the desired output frequency, thus the conventional voltage controlled oscillator would consume more power than the sampling voltage controlled oscillator 200 of the present invention.

In an embodiment of the invention, sample and hold circuitry 220 may be implemented as a D flip flop. However, it is contemplated that other types of designs may be employed to provide the sample and hold functionality without departing from the scope and intent of the present invention.

Figure 3:
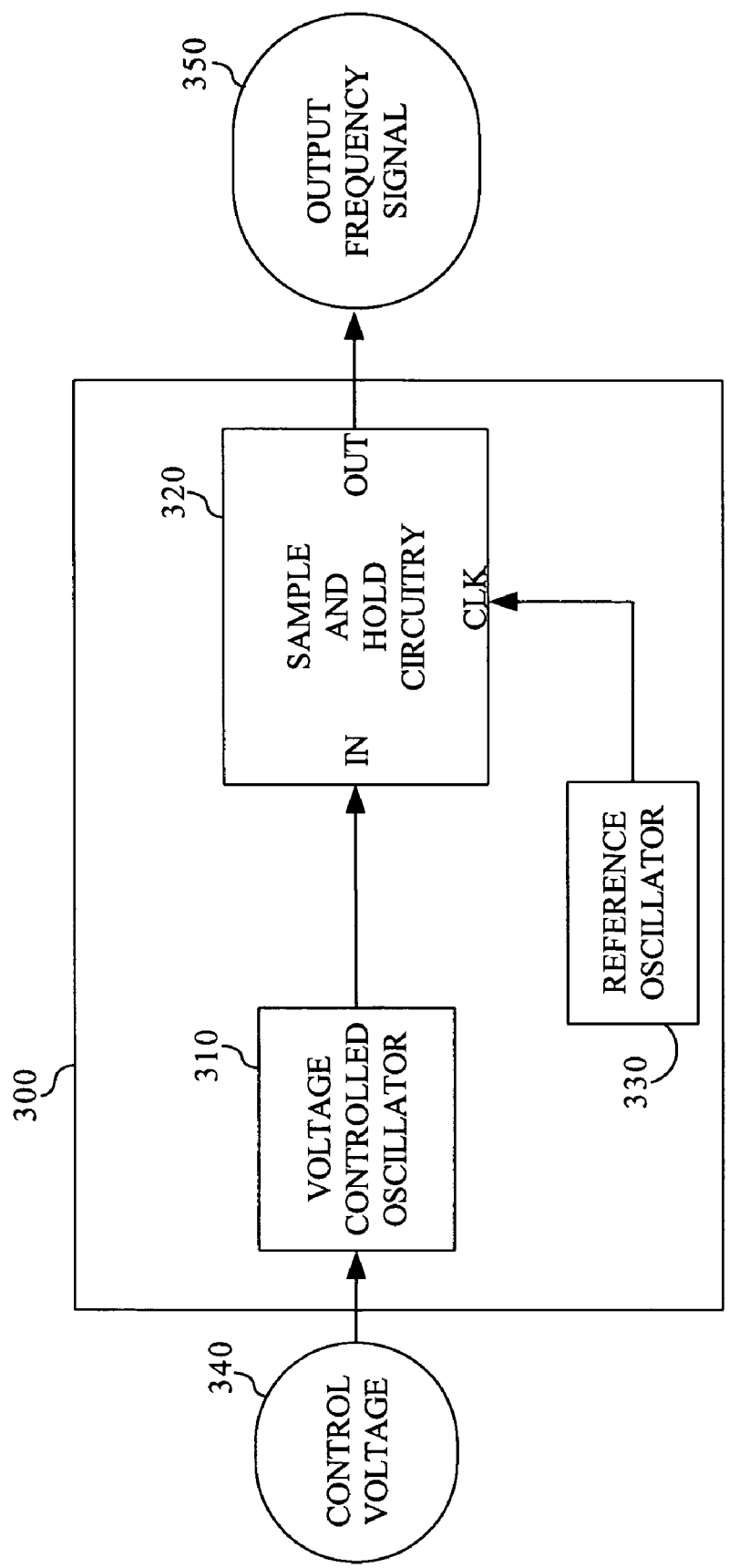
FIG. 3 depicts a block diagram of a sampling voltage controlled oscillator in accordance with an alternative embodiment of the present invention.

Referring now to FIG. 3, a block diagram of a sampling voltage controlled oscillator 300 in accordance with an alternative embodiment of the present invention is shown. Sampling voltage controlled oscillator 300 may include a voltage controlled oscillator 310 and sample and hold circuitry 320. Voltage controlled oscillator 310 may be controlled by a control voltage 340, for example. Control voltage 340 may be produced by a phase detector representing a phase difference between two signals. A clock of the sample and hold circuitry 320 may be coupled a reference oscillator 330.

Sample and hold circuitry 320 may derive a higher output frequency signal 350 than the output frequency produced by voltage controlled oscillator. For example, an output frequency signal of 3.4 GHz may be produced from the voltage controlled oscillator 310 providing a signal with frequency of 200 MHz when the reference oscillator 330 provides an 800 MHz signal. This is advantageous as an output frequency signal 350 may be produced by the sampling voltage controlled oscillator 300 with reduced power consumption due to the reduced voltage controlled oscillator frequency of voltage controlled oscillator 310.

Figure 4:
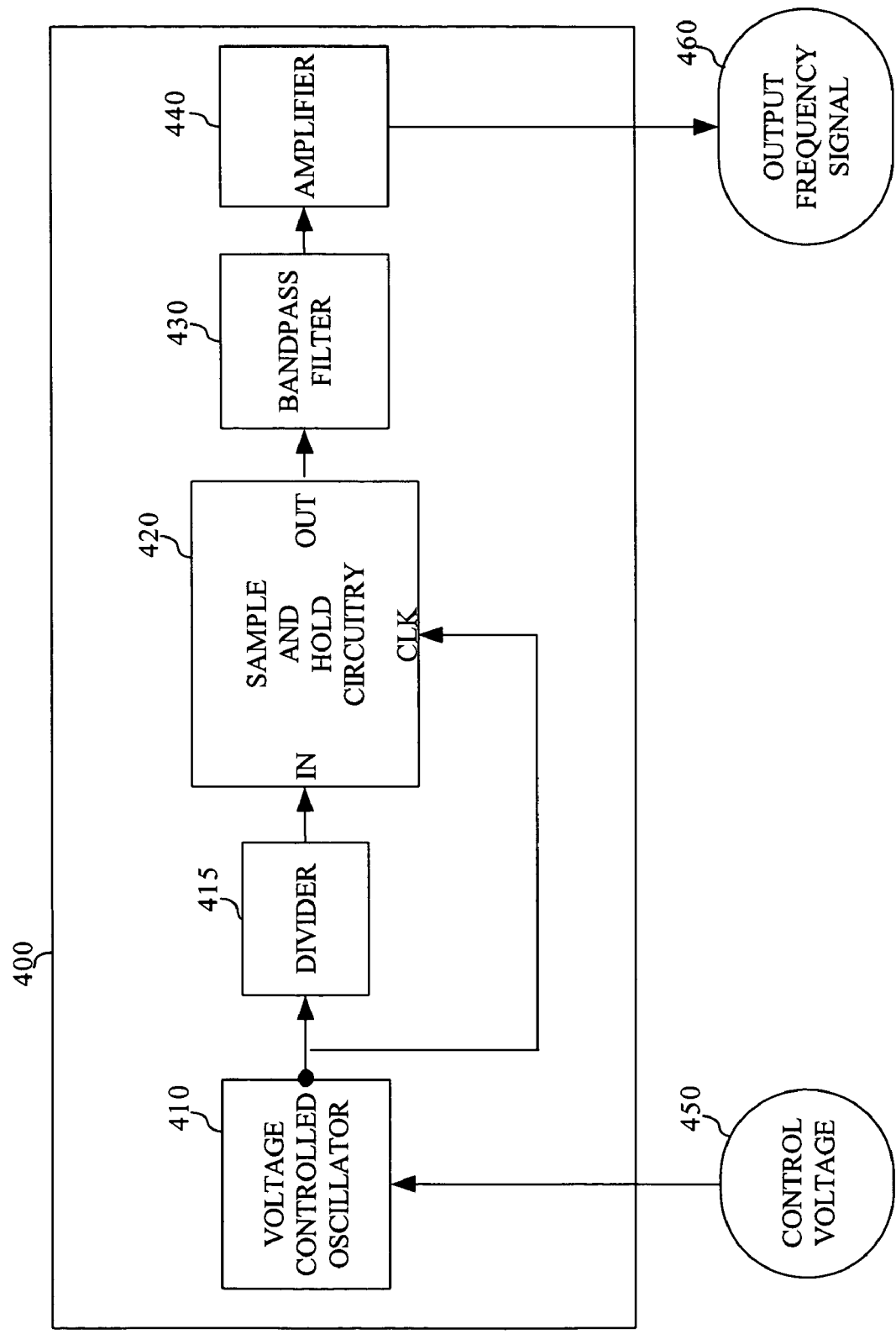
FIG. 4 depicts a block diagram of a sampling voltage controlled oscillator in accordance with a second alternative embodiment of the present invention.

Referring now to FIG. 4, a block diagram of a sampling voltage controlled oscillator 400 in accordance with a second alternative embodiment of the present invention is shown. Sampling voltage controlled oscillator 400 may include a voltage controlled oscillator 410, divider 415, sample and hold circuitry 420, a bandpass filter 430 and amplifier 440. The sampling voltage controlled oscillator 400 may include a control voltage input 450 and may produce an output frequency signal 460, similar to the operation of sampling voltage controlled oscillators 200, 300 of FIGS. 2–3. Sampling voltage controlled oscillator 400 may include a bandpass filter 430 and an amplifier 440 to refine the output frequency signal 460.

Figure 5:
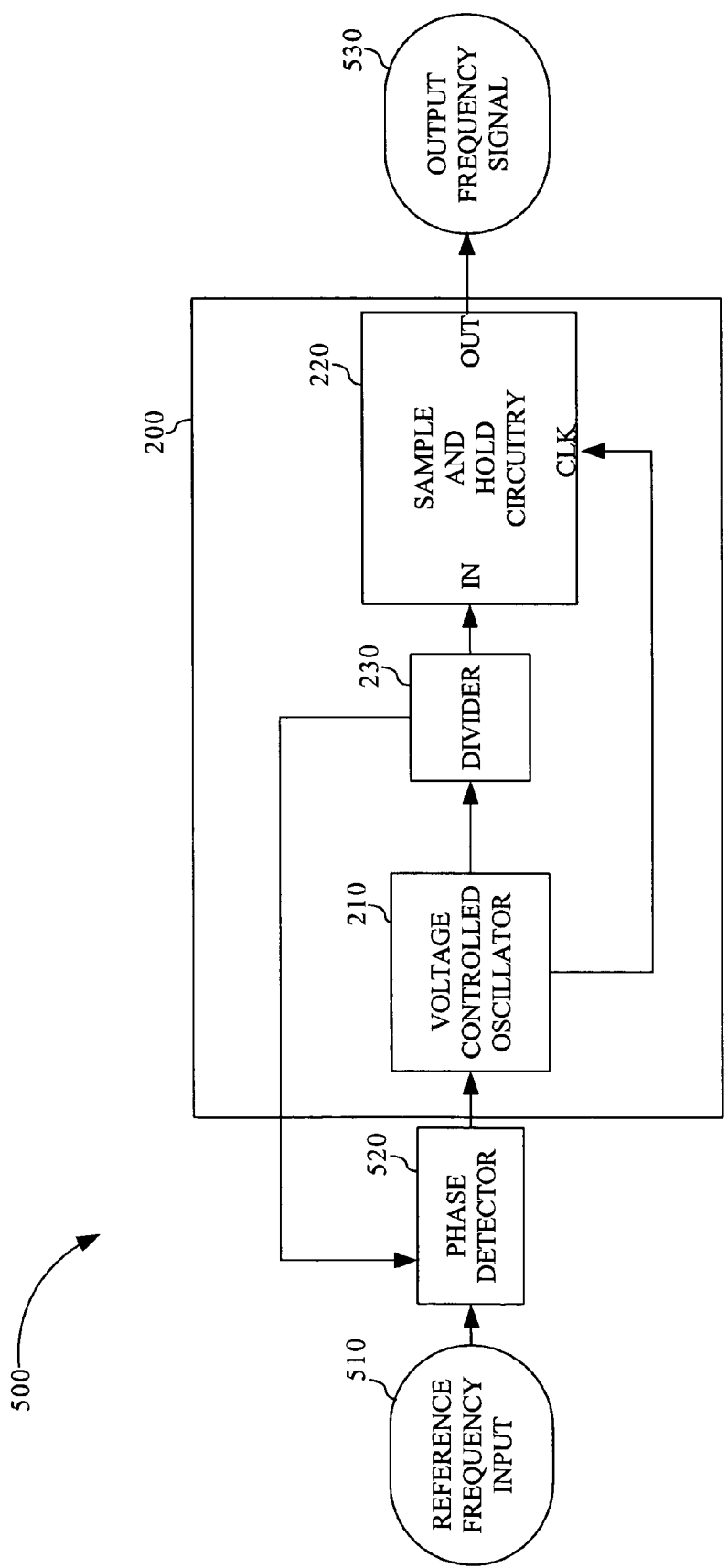
FIG. 5 depicts a block diagram of a phase-locked loop in accordance with an embodiment of the present invention.

Referring to FIG. 5, a phase-locked loop 500 in accordance with an embodiment of the present invention is shown. Phase locked-loop 500 may include a sampling voltage controlled oscillator 200 of FIG. 2, including a voltage controlled oscillator 210, sample and hold circuitry 220 and a frequency divider 230. Phase-locked loop 500 may also include a reference frequency input 510 and a phase detector 520. Phase-locked loop 500 may produce an output frequency signal 530.

Reference frequency input 510 may be a reference oscillator such as a crystal oscillator. Phase detector 520 may compare a reference frequency input 510 with the divided frequency signal of the voltage controlled oscillator 210. The phase difference from the phase detector may be fed to the voltage controlled oscillator 210. In an advantageous aspect of the present invention, voltage controlled oscillator 210 may operate at a frequency which may be a fraction of the output frequency signal 530 of the phase-locked loop.

Sample and hold circuitry 220 may derive a higher output frequency signal 530 than the output frequency signal produced by the voltage controlled oscillator 210. For example, sample and hold circuitry 220 may create images of an input signal folded around multiples of a clock frequency. This is advantageous as an output frequency signal 530 may be produced by the sampling voltage controlled oscillator 200 with reduced power consumption due to the reduced voltage controlled oscillator frequency of voltage controlled oscillator 210.

It is contemplated that phase-locked loop 500 may employ sampling voltage controlled oscillators 300, 400 of FIGS. 3–4 without departing from the scope and intent of the present invention. For example, phase-locked loop 500 may include a reference oscillator 330 rather than a divider. Also, phase-locked loop may include a bandpass filter 430 and amplifier 440 of FIG. 4. Additionally, it is contemplated that sampling voltage controlled oscillators 200, 300 and 400 of FIGS. 2–4 may be employed in applications other than phase-locked loops without departing from the scope and intent of the present invention.

It is believed that the present invention and many of its attendant advantages will be understood by the foregoing description, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. An apparatus, comprising:
   a voltage controlled oscillator;
   a frequency divider coupled to an output of said voltage controlled oscillator; and
   sample and hold circuitry coupled to said voltage controlled oscillator, wherein a frequency signal produced by said voltage controlled oscillator is sampled by said sample and hold circuitry, said sample and hold circuitry providing an output frequency signal, said output frequency signal being a higher frequency than a frequency of said frequency signal produced by said voltage controlled oscillator, said sample and hold circuitry including an input, an output, and a clock and said frequency divider being coupled to said input of said sample and hold circuitry.

2. The apparatus as claimed in claim 1, further comprising a filter coupled to said output of said sample and hold circuitry for filtering said output frequency.

3. The apparatus as claimed in claim 2, further comprising an amplifier coupled to an output of said filter.

4. A phase-locked loop, comprising
   a phase detector;

a voltage controlled oscillator coupled to said phase detector;

a frequency divider coupled to an output of said voltage controlled oscillator;

sample and hold circuitry, said sample and hold circuitry including an input, an output and a clock, said clock of said sample and hold circuitry being coupled to an output of said voltage controlled oscillator; and a filter coupled to said output of said sample and hold circuitry for filtering said output frequency signal, wherein a frequency signal produced by said voltage controlled oscillator is sampled by said sample and hold circuitry, said sample and hold circuitry providing an output frequency signal, said output frequency signal being a higher frequency than said frequency signal produced by said voltage controlled oscillator, said phase detector compares a reference frequency signal and a divided frequency signal of said frequency signal produced by said voltage controlled oscillator, said reference frequency signal being produced by a reference oscillator.

5. The apparatus as claimed in claim 4, further comprising an amplifier coupled to an output of said filter.

6. An apparatus, comprising:

a voltage controlled oscillator;

a frequency divider coupled to an output of said voltage controlled oscillator;

sample and hold circuitry coupled to said voltage controlled oscillator;

a filter coupled to an output of said sample and hold circuitry; and an amplifier coupled to an output of said filter, wherein a frequency signal produced by said voltage controlled oscillator is sampled by said sample and hold circuitry, said sample and hold circuitry providing an output frequency signal, said output frequency signal being a higher frequency than said frequency signal produced by said voltage controlled oscillator, said output frequency signal being filtered by said filter, said sample and hold circuitry includes an input, an output, and a clock, said signal produced by said voltage controlled oscillator is divided by said frequency divider.

7. The apparatus as claimed in claim 6, wherein said sample and hold circuitry is a D flip flop.

8. The apparatus as claimed in claim 6, wherein a divided frequency signal is fed to said input of said sample and hold circuitry.

9. The apparatus as claimed in claim 6, wherein said frequency signal produced by said voltage controlled oscillator is fed to said clock of said sample and hold circuitry.

10. The apparatus as claimed in claim 6, further comprising a reference oscillator.

11. The apparatus as claimed in claim 10, said reference oscillator being coupled to said clock of said sample and hold circuitry.

* * * * *